United States Patent
Ueno et al.

(10) Patent No.: US 10,461,236 B2
(45) Date of Patent: Oct. 29, 2019

(54) THERMOELECTRIC GENERATOR

(71) Applicant: KABUSHIKI KAISHA TOSHIBA, Minato-ku (JP)

(72) Inventors: Takeshi Ueno, Kawasaki (JP); Taichi Ogawa, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 558 days.

(21) Appl. No.: 15/063,809

(22) Filed: Mar. 8, 2016

(65) Prior Publication Data

US 2016/0293824 A1    Oct. 6, 2016

(30) Foreign Application Priority Data

Mar. 31, 2015 (JP) ................................. 2015-073580

(51) Int. Cl.
*H01L 35/32* (2006.01)
*H02M 3/156* (2006.01)
*H02M 1/00* (2006.01)

(52) U.S. Cl.
CPC ............ *H01L 35/32* (2013.01); *H02M 3/156* (2013.01); *H02M 2001/0022* (2013.01); *H02M 2001/0035* (2013.01); *Y02B 70/16* (2013.01)

(58) Field of Classification Search
CPC .................... H02M 3/156; H01L 35/32
See application file for complete search history.

(56) References Cited

U.S. PATENT DOCUMENTS

| | | | |
|---|---|---|---|
| 6,204,645 B1* | 3/2001 | Cullen | G05F 1/67 320/102 |
| 2001/0006342 A1* | 7/2001 | Kusumoto | H02M 3/155 323/355 |
| 2004/0176859 A1* | 9/2004 | Chian | H02J 7/34 700/12 |
| 2010/0270996 A1* | 10/2010 | Ramadas | H02M 1/36 323/311 |
| 2010/0320992 A1* | 12/2010 | Dearn | H02M 3/1582 323/311 |
| 2012/0306278 A1* | 12/2012 | Fajtl | H02M 3/156 307/82 |
| 2013/0335054 A1* | 12/2013 | Pigott | H02M 3/1588 323/311 |

(Continued)

FOREIGN PATENT DOCUMENTS

JP    2014-217250    11/2014

OTHER PUBLICATIONS

Jungmoon Kim, et al., "A DC-DC Boost Converter With Variation-Tolerant MPPT Technique and Efficient ZCS Circuit for Thermoelectric Energy Harvesting Applications ", IEEE Transactions on Power Electronics, vol. 28, (8), 2013, 7 pgs.

(Continued)

*Primary Examiner* — Magali P Slawski
(74) *Attorney, Agent, or Firm* — Oblon, McClelland, Maier & Neustadt, L.L.P.

(57) ABSTRACT

According to an embodiment, a thermoelectric generator includes a thermoelectric element and a DC to DC converter. The thermoelectric element converts heat energy into electric energy. The DC to DC converter increases an input voltage applied by the thermoelectric element. The input voltage is higher than a voltage which is half an open voltage of the thermoelectric element.

3 Claims, 4 Drawing Sheets

(56) References Cited

U.S. PATENT DOCUMENTS

2014/0299169 A1* 10/2014 Schneider ............... H01L 35/02
136/201

OTHER PUBLICATIONS

Elie Lefeuvre, et al., "Buck-Boost Converter for Sensorless Power Optimization of Piezoelectric Energy Harvester", IEEE Transactions on Power Electronics, vol. 22, (5), 2007, 8 pgs.

* cited by examiner

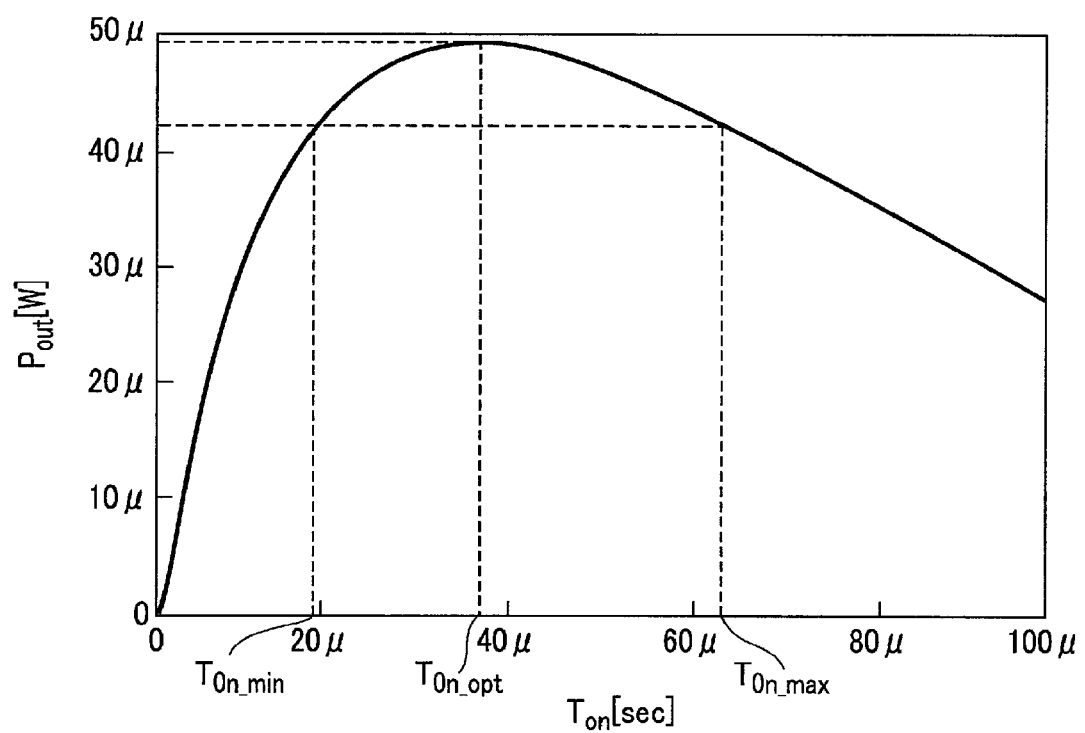
F I G. 5

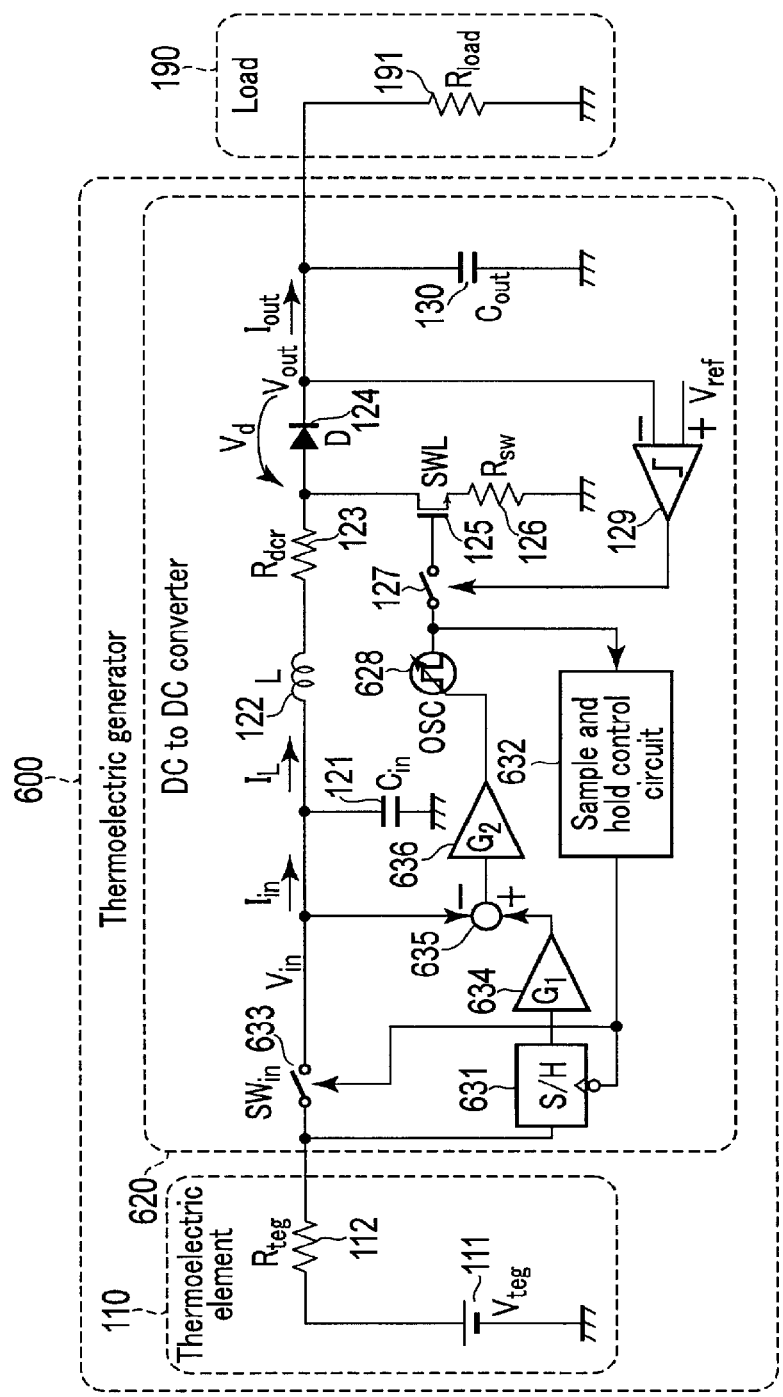
F I G. 6 # THERMOELECTRIC GENERATOR

CROSS-REFERENCE TO RELATED APPLICATIONS

This application is based upon and claims the benefit of priority from Japanese Patent Application No. 2015-073580, filed Mar. 31, 2015, the entire contents of which are incorporated herein by reference.

FIELD

Embodiments described herein relate to thermoelectric generation.

BACKGROUND

In recent years, energy harvesting technology which harvests ambient small energy and provides power is attracting interest. A thermoelectric generator which uses heat as an energy source comprises a thermoelectric element for converting heat energy into electric energy, and a DC to DC converter for converting an input voltage from the thermoelectric element into a voltage of a desired level. To maximize the output power of the DC to DC converter, the output voltage of the thermoelectric element is set at a value which is half the open voltage (electromotive force) of the thermoelectric element. This technique, however, does not consider the effect caused by the parasitic resistance of the DC to DC converter, and the output power of the DC to DC converter is not necessarily maximized.

BRIEF DESCRIPTION OF THE DRAWINGS

FIG. 5 is a graph exemplifying how the ON time of the switch control signal and the output power of the DC to DC converter are related in a thermoelectric generator according to the second embodiment.

FIG. 6 is a circuit diagram exemplifying a thermoelectric generator according to the third embodiment.

DETAILED DESCRIPTION

A description will now be given of the embodiments with reference to the accompanying drawings.

According to an embodiment, a thermoelectric generator includes a thermoelectric element and a DC to DC converter. The thermoelectric element converts heat energy into electric energy. The DC to DC converter increases an input voltage applied by the thermoelectric element. The input voltage is higher than a voltage which is half an open voltage of the thermoelectric element.

In the descriptions given below, the same or corresponding constituent elements are denoted by the same reference numbers, and redundant descriptions will be avoided.

(First Embodiment)

Figure 1:
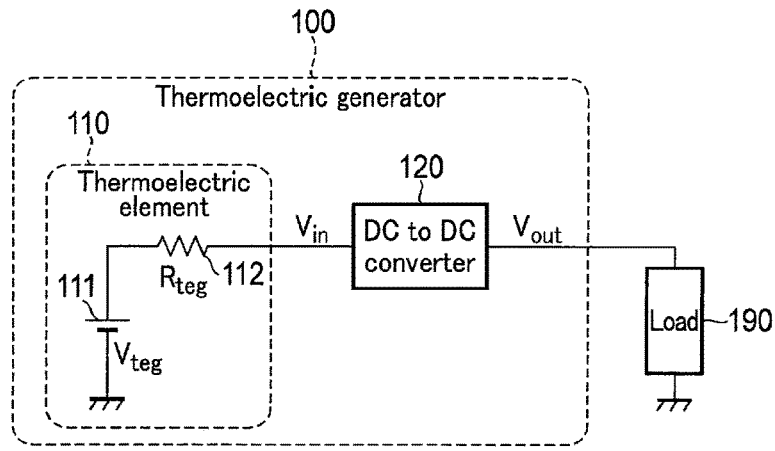
FIG. 1 is a block diagram schematically illustrating a thermoelectric generator according to the first embodiment.

As exemplified in FIG. 1, the thermoelectric generator 100 according to the first embodiment comprises a thermoelectric element 110 and a DC to DC converter 120. The output terminal of the thermoelectric generator 100 may be connected to a load 190.

The thermoelectric element 110 includes an output terminal. The output terminal of the thermoelectric element 110 is connected to the input terminal of the DC to DC converter 120. The thermoelectric element 110 converts heat energy into electric energy and applies a voltage equal to $V_{in}$ to the input terminal of the DC to DC converter 120.

The thermoelectric element 110 can be regarded as a model including a voltage source 111 whose electromotive force is equal to $V_{teg}$[V] and an output resistor 112 whose resistance is $R_{teg}$[Ω]. $V_{teg}$ is proportional to the temperature difference between a high-temperature member and a low-temperature member included in the thermoelectric element 110. Where the temperature difference is several °C., $V_{teg}$ is several dozen mV to several hundred mV. On the other hand, $R_{teg}$ is a substantially constant value irrespective of the temperature and is several Ω to several hundred Ω.

The DC-to DC converter 120 includes an input terminal and an output terminal. The input terminal of the DC to DC converter 120 is connected to the output terminal of the thermoelectric element 110. The output terminal of the DC to DC converter 120 is connected to the output terminal of the thermoelectric generator 100. The DC to DC converter 120 produces an output voltage ($V_{out}$) by increasing (or decreasing) the input voltage ($V_{in}$). The DC to DC converter 120 applies the output voltage ($V_{out}$) to the load 190.

Where the load 190 is an ordinary type of electronic device, it operates on a power supply voltage of 1V or higher. Typically, therefore, $V_{out}$ is greater than $V_{in}$ ($V_{out}$>$V_{in}$), and the DC to DC converter 120 is a boosting type DC to DC converter.

Figure 2:
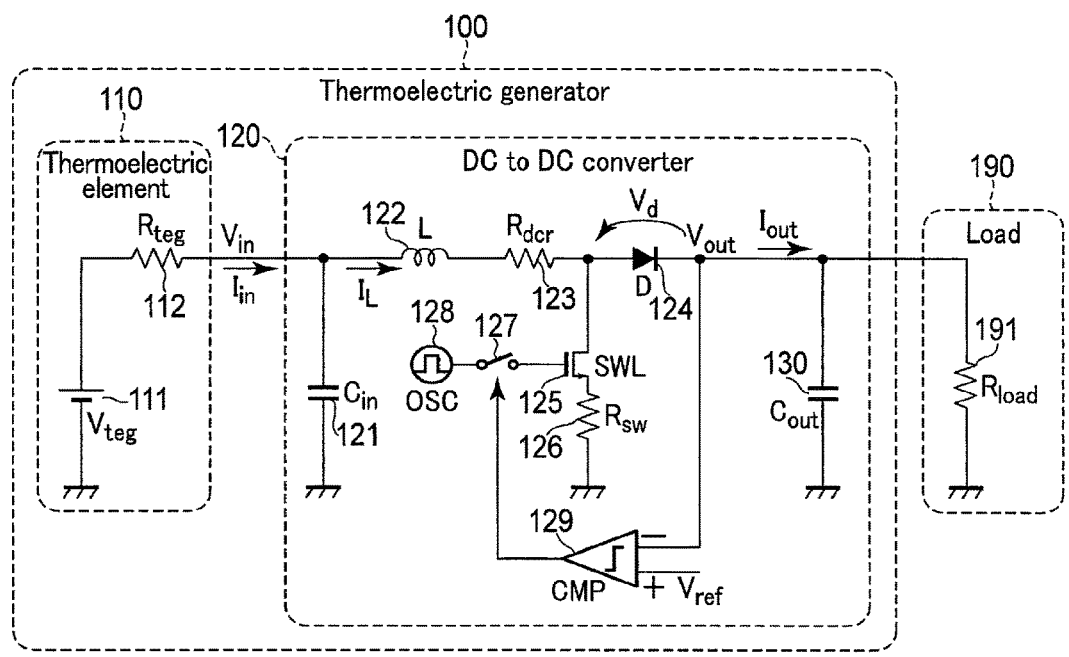
FIG. 2 is a circuit diagram exemplifying a configuration of the thermoelectric generator of the first embodiment.

A specific configuration of the DC to DC converter 120 is exemplified in FIG. 2. The DC to DC converter 120 shown in FIG. 2 includes an input capacitor 121 ($C_{in}$), an inductor 122, a diode 124 (D), switch 125 (SWL), switch 127, an oscillator 128, a comparator 129 (CMP), and an output capacitor 130 ($C_{out}$). In FIG. 2, the parasitic resistance 123 of the inductor 122 and the parasitic resistance (ON resistance) 126 of switch 125 are shown.

The input capacitor 121 includes a first terminal and a second terminal. The first terminal of the input capacitor 121 is connected to the input terminal of the DC to DC converter 120 and to the first terminal of the inductor 122. The second terminal of the capacitor 121 is grounded. An input current ($I_{in}$) is smoothed by the input capacitor 122 which absorbs the ripple at the inductor current ($I_L$).

The inductor 122 includes a first terminal and a second terminal. The first terminal of the inductor 122 is connected to the input terminal of the DC to DC converter 120 and the first terminal of the input capacitor 121. The second terminal of the inductor 122 is connected to both an anode of the diode 124 and the first terminal of the switch 125. In the example shown in FIG. 2, the inductor 122 has a parasitic resistance 123 of $R_{dcr}$[Ω], and this parasitic resistance 123 is inserted between the second terminal of the inductor 122 and the anode of the diode 124 and between the second terminal of the inductor 122 and the first terminal of switch 125.

The inductor 122 stores magnetic energy by an inductor current ($I_L$) flowing through the inductor 122 while the switch 125 is in the ON state. The inductor 122 discharges the stored magnetic energy as electric energy while the switch 125 (SW$_1$) is in the OFF state.

The diode 124 includes an anode and a cathode. The anode of the diode 124 is connected to both the second terminal of the inductor 122 and the first terminal of the switch 125. The cathode of the diode 124 is connected to the output terminal of the DC to DC converter 120, the first terminal of the output capacitor 130 and the first input terminal of the comparator 129.

The diode 124 allows a current supplied from the inductor 122 to flow to the output capacitor 130 after the switch 112 is switched to the OFF state from the ON state. The diode 124 also prevents a current from flowing back to the thermoelectric element 110 from the output capacitor 130.

Switch 125 includes a first terminal, a second terminal and a control terminal. The first terminal of the switch 125 is connected to both the second terminal of the inductor 122 and the anode of the diode 124. The second terminal of switch 125 is grounded. In the example shown in FIG. 2, switch 125 has a parasitic resistance 126 of R$_{dcr}$ [Ω], and this parasitic resistance 126 is inserted between the second terminal of switch 125 and the ground. The control terminal of switch 125 is connected to the second terminal of switch 127.

Switch 125 receives a switch control signal from switch 127 in the ON state, and is turned ON/OFF in accordance with the switch control signal. To be specific, switch 125 short-circuits its first and second terminals or disconnects them in accordance with the switch control signal, in such a manner that the second terminal of the inductor 122 and the anode of the diode 124 are switched between the grounded state and the non-grounded state. When switch 127 is in the OFF state, switch 125 cannot receive the switch control signal and is therefore in the OFF state irrespective of the signal level of the switch control signal.

Switch 127 includes a first terminal, a second terminal and a control terminal. The first terminal of switch 127 is connected to the output terminal of the oscillator 128. The second terminal of switch 127 is connected to the control terminal of switch 125. The control terminal of switch 127 is connected to the output terminal of the comparator 129.

Switch 127 receives a comparison result signal from the comparator 129 and is turned ON/OFF in accordance with the comparison result signal. To be specific, switch 127 short-circuits its first and second terminals or disconnects them in accordance with the comparison result signal, in such a manner that the switch control signal to switch 125 is switched between the supplied state and the non-supplied state.

The oscillator 128 includes an output terminal. The output terminal of the oscillator 128 is connected to the first terminal of switch 127. The oscillator 128 generates a switch control signal and supplies this switch control signal to switch 127.

The comparator 129 includes a first input terminal, a second input terminal and an output terminal. The first input terminal of the comparator 129 is connected to the output terminal of the DC to DC converter 120, the cathode of the diode 124 and the first terminal of the output capacitor 130. The first input terminal of the comparator 129 may be applied with a voltage obtained by dividing the output voltage (V$_{out}$) of the DC to DC converter 120, instead of the output voltage (V$_{out}$) of the DC to DC converter 120. The second input terminal of the comparator 129 is applied with a reference voltage (V$_{ref}$) from a reference voltage source (not shown). The output terminal of the comparator 129 is connected to the control terminal of switch 127.

The comparator 129 compares the voltage (V$_{out}$) applied to the first input terminal with the voltage (V$_{ref}$) applied to the second input terminal. If V$_{out}$<V$_{ref}$, the comparator 129 generates a comparison result signal of high level, and switch 127 is set in the ON state by that comparison result signal. As a result, the switch control signal is supplied to switch 125, increasing V$_{out}$. If V$_{out}$≥V$_{ref}$, the comparator 129 generates a comparison result signal of low level, and switch 127 is set in the OFF state by that comparison result signal. Therefore, the switch control signal is not supplied to switch 125, and V$_{out}$ decreases.

The output capacitor 130 includes a first terminal and a second terminal. The first terminal of the output capacitor 130 is connected to the output terminal of the DC to DC converter 120, the cathode of the diode 124 and the first input terminal of the comparator 129. The second terminal of the output capacitor 130 is grounded. The output capacitor 130 may be an ordinary type of capacitor; alternatively, it may be a super capacitor or a secondary battery capable of storing a large amount of energy.

The output capacitor 130 is charged by a current supplied from the diode 124 after switch 125 is switched to the OFF state from the ON state. Accordingly, the voltage (V$_{out}$) at the first terminal of the output capacitor 130 increases. On the other hand, if the current supply from the diode 124 is stopped, the capacitor 130 discharges. Accordingly, the voltage (V$_{out}$) at the first terminal of the output capacitor 130 decreases. The output voltage (V$_{out}$) is smoothed by the charging/discharging of the output capacitor 130.

The load 190 may be any type of load, such as an electronic device or a secondary battery. The load 190 is connected to the output terminal of the DC to DC converter 120. The load 190 performs various operations, making use of the power supplied from the DC to DC converter 120. In the example shown in FIG. 2, the load 190 is regarded as a model that uses a load resistor 191.

Consideration will be given as to how the input voltage (V$_{in}$) of the DC to DC converter 120 should be determined in order to provide a greater output power of the DC to DC converter 120 than the conventional art.

The output power (P$_{out}$) of the DC to DC converter 120 can be calculated by subtracting the power loss (Ploss) caused by parasitic resistances 123 and 126 from the input power (P$_{in}$=V$_{in}$I$_{in}$) of the DC to DC converter 120. In the description below, P$_{out}$ is expressed as a function of V$_{in}$, so as to derive V$_{in}$ that enables P$_{out}$ to be greater than that of the conventional art.

Figure 3:
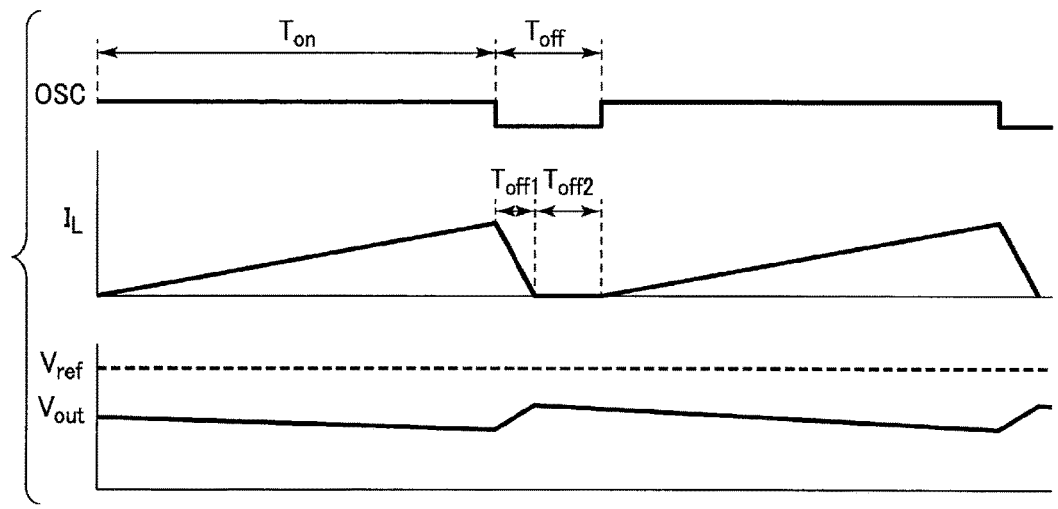
FIG. 3 is a timing chart exemplifying waveforms of a switch control signal, an inductor current and an output voltage of a direct current to direct current converter (DC to DC converter), which are used by the thermoelectric generator shown in FIG. 2.

As shown in FIG. 3, the switch control signal (OSC) described above repeatedly transitions between high level and low level. When the switch control signal is at high level, switch 125 is in the ON state, and the inductor current (I$_L$) increases. On the other hand, when the switch control signal is at low level, switch is in the OFF state, and the inductor current (I$_L$) decreases.

In the example shown in FIG. 3, the inductor current (I$_L$) decreases to zero before the switch control signal transitions from low level to high level. The control in which the inductor current is temporarily made zero is referred to as a discontinuous conduction mode (DCM) control. The control in which the inductor current is kept from becoming zero is referred to as a continuous conduction mode (CCM) control.

Where DCM control is performed for the DC to DC converter 120, the input resistance of the DC to DC converter 120 can be regarded as constant irrespective of the input voltage (V$_{in}$) and output voltage (V$_{out}$). Therefore, the input resistance of the DC to DC converter 120 and the output resistance (R$_{reg}$) of the thermoelectric element 110 can be easily matched with each other (refer to E. Lefeuvre, D. Audigier, C. Richard and D. Guyomar, "Buck-Boost Converter for Sensorless Power Optimization of Piezoelectric Energy Harvester", IEEE Transactions on Power Electronics, vol. 22, pp. 2018-2025, 2007.)

Let us assume that $T_{on}$ is a time (ON time) when the switch control signal is kept at high level and that $T_{off}$ is a time when the switch control signal is at low level. Let us also assume that time $T_{off}$ includes time $T_{off1}$ which is before the inductor current ($I_L$) becomes zero and $T_{off2}$ which is after the inductor current ($I_L$) becomes zero.

Since typically $V_{in} \ll V_{out}$ in thermoelectric generation, $T_{on} \gg T_{off1}$. In order to reduce the conduction loss caused by the parasitic resistance (specifically parasitic resistance 123 and parasitic resistance 126), it is effective to suppress the ripple components of the inductor current. For this reason, time $T_{off2}$ should be as short as possible. With the above taken into consideration, it is possible to assume that $T_{on} \gg T_{off} (= T_{off1} + T_{off2})$.

In consideration of the smoothing by the input capacitor 121, the input current ($I_{in}$) of the DC to DC converter 120 is equal to the average value of the inductor current ($I_L$). Hence, formula (1) set forth below is established. In formula (1), L denotes an inductance of the inductor 122.

$$I_{in} \approx \frac{1}{T_{on}} \int_0^{T_{on}} \frac{V_{in}}{L} t \, dt = \frac{1}{2} \cdot \frac{T_{on}}{L} V_{in} \quad (1)$$

The effective value ($I_{Lrms}$) of the inductor current can be derived from formula (2) set forth below.

$$I_{Lrms} \approx \sqrt{\frac{1}{T_{on}} \int_0^{T_{on}} \left(\frac{V_{in}}{L} t\right)^2 dt} = \frac{1}{\sqrt{3}} \cdot \frac{T_{on}}{L} V_{in} \quad (2)$$

The input voltage ($V_{in}$) can be obtained by subtracting the voltage decrease ($R_{teg} I_{in}$) caused by the output resistor 112 from the electromotive force ($V_{teg}$) of the voltage source 111, as indicated in formula (3) set forth below.

$$V_{in} \approx V_{teg} - R_{teg} I_{in} \quad (3)$$

Formula (4), set forth below, can be obtained by rewriting formula (3) with respect to $I_{in}$.

$$I_{in} \approx \frac{V_{teg} - V_{in}}{R_{teg}} \quad (4)$$

Formula (5), set forth below, can be obtained by rewriting the right side of formula (2), using formulas (1) and (4).

$$I_{Lrms} \approx \frac{2\sqrt{3}}{3} \cdot \frac{V_{teg} - V_{in}}{R_{teg}} \quad (5)$$

Furthermore, formula (6), set forth below, can be obtained by rewriting the left side of formula (1) with respect to $T_{on}$, using formula (4).

$$T_{on} \approx \frac{2L}{V_{in}} \cdot \frac{V_{teg} - V_{in}}{R_{teg}} \quad (6)$$

By using formulas (4) and (5), the output power ($P_{out}$) of the DC to DC converter 120 can be expressed as a function of the input voltage ($V_{in}$), as expressed in formula (7) set forth below.

$$\begin{aligned} P_{out} &= P_{in} - P_{loss} \\ &= V_{in} I_{in} - I_{Lrms}^2 (R_{dcr} + R_{sw}) \\ &\approx \frac{V_{in}(V_{teg} - V_{in})}{R_{teg}} - \frac{4}{3} \cdot \frac{(V_{teg} - V_{in})^2 (R_{dcr} + R_{sw})}{R_{teg}^2} \end{aligned} \quad (7)$$

Figure 4:
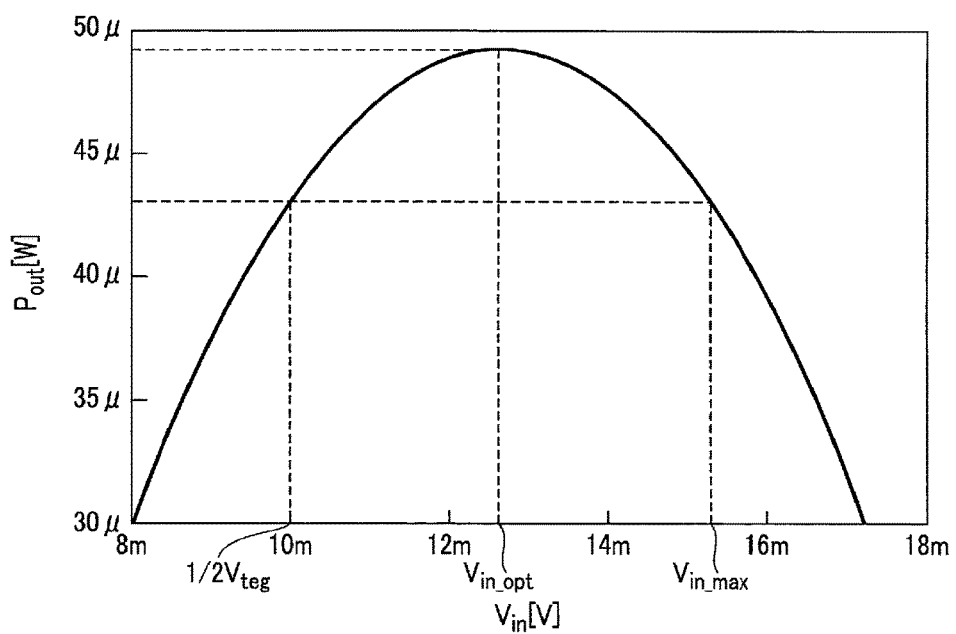
FIG. 4 is a graph exemplifying relations between the input voltage and output power of the DC to DC converter included in the thermoelectric generator shown in FIG. 2.

FIG. 4 exemplifies relations between the output power ($P_{out}$) and the input voltage ($V_{in}$). In the example in FIG. 4, $V_{teg}=20$ mV, $R_{teg}=1.5\Omega$, $L=47$ μH, $R_{dcr}=0.2\Omega$, and $R_{sw}=0.2\Omega$. $P_{out}$ describes a curve (parabola) which is convex upward, and is greater than the conventional value (namely, than the case where $V_{in}=V_{teg}/2$) if $V_{in}$ satisfies the relation $V_{teg}/2 < V_{in} < V_{in\_max}$.

With respect to an optimal value ($V_{in\_opt}$) that permits the output power ($P_{out}$) of the DC to DC converter 120 to be maximal, the following formula (8) is given:

$$\left. \frac{\partial P_{out}}{\partial V_{in}} \right|_{V_{in}=V_{in\_opt}} = 0 \quad (8)$$

Formula (9) can be derived using both formulas (7) and (8).

$$V_{in\_opt} \approx \frac{1}{2} \cdot \frac{8(R_{dcr} + R_{sw}) + 3R_{teg}}{4(R_{dcr} + R_{sw}) + 3R_{teg}} V_{teg} \quad (9)$$

With respect to an upper limit ($V_{in\_max}$) of the input voltage ($V_{in}$) that makes the output power ($P_{out}$) of the DC to DC converter 120 greater than the conventional value, formula (10) set forth below can be given, using formula (7).

$$V_{in\_max} \approx \frac{3}{2} \cdot \frac{4(R_{dcr} + R_{sw}) + R_{teg}}{4(R_{dcr} + R_{sw}) + 3R_{teg}} V_{teg} \quad (10)$$

As described above, the thermoelectric generator of the first embodiment enables the input voltage of the DC to DC converter to be set at a value higher than half the open voltage (electromotive force) of the thermoelectric element. To be more specific, in the thermoelectric generator, the input voltage of the DC to DC converter is set at a value which is higher than half the open voltage of the thermoelectric element and which is lower than the upper limit given by formula (10). Therefore, in comparison with the case where the input voltage of the DC to DC converter is set at a value half the open voltage of the thermoelectric element, the thermoelectric generator enables increasing the output power of the DC to DC converter. In addition, the output power can be maximized by setting the input voltage of the DC to DC converter at an optimal value given by formula (9).

(Second Embodiment)

In the thermoelectric generator of the first embodiment described above, the input voltage of the DC to DC converter is set to be within an appropriate range, thereby making the output power greater than the power in the conventional art. As can be seen in formulas (1) and (3), the input voltage ($V_{in}$) of the DC to DC converter is dependent on the ON time ($T_{on}$) of the switch control signal (OSC). Therefore, provided that $T_{on}$ of the DC to DC converter is variable, the output power can be made greater than a value in the conventional art by setting $T_{on}$ to be within an appropriate range.

The thermoelectric generator of the second embodiment differs from the thermoelectric generator of the first embodiment in that the ON time ($T_{on}$) of the switch control signal (OSC) is variable. In the description below, $P_{out}$ is expressed as a function of $T_{on}$, so as to derive $T_{on}$ that enables $P_{out}$ to be greater than that of the conventional art.

Formula (11), set forth below, can be obtained by substituting the right side of formula (3) for $V_{in}$ of formula (1) and rewriting the resultant formula with respect to $I_{in}$.

$$I_{in} \approx \frac{T_{on}}{R_{teg}T_{on} + 2L} V_{teg} \quad (11)$$

Similarly, formula (12), set forth below, can be obtained by substituting the right side of formula (3) for $V_{in}$ of formula (2) and rewriting the resultant formula with respect to $I_{Lrms}$.

$$I_{Lrms} \approx \frac{2}{\sqrt{3}} \cdot \frac{T_{on}}{R_{teg}T_{on} + 2L} V_{teg} \quad (12)$$

Formula (13), set forth below, can be obtained by substituting the right side of formula (11) for $I_{in}$ of formula (3).

$$V_{in} \approx \frac{2L}{R_{teg}T_{on} + 2L} V_{teg} \quad (13)$$

By using formulas (11), (12) and (13), the output power ($P_{out}$) of the DC to DC converter 120 can be expressed as a function of the ON time ($T_{on}$), as expressed in formula (14) set forth below.

$$\begin{aligned} P_{out} &= P_{in} - P_{loss} \\ &= V_{in}I_{in} - I_{Lrms}^2(R_{dcr} + R_{sw}) \\ &\approx \frac{2}{3} \cdot \frac{3LT_{on} - 2(R_{dcr} + R_{sw})T_{on}^2}{(R_{teg}T_{on} + 2L)^2} V_{teg}^2 \end{aligned} \quad (14)$$

FIG. 5 exemplifies relations between the output voltage ($P_{out}$) and the ON time ($T_{on}$). In the example in FIG. 5, $V_{teg}=20$ mV, $R_{teg}=1.5\Omega$, $L=47$ µH, $R_{dcr}=0.2\Omega$, and $R_{sw}=0.2\Omega$. $P_{out}$ describes a curve which is convex upward, and is greater than the conventional value (namely, than the case where $V_{in}=V_{teg}/2$) if $T_{on}$ satisfies the relation $T_{on\_min} < T_{on} < T_{on\_max}$.

With respect to an optimal value ($T_{on\_opt}$) that permits the output voltage ($P_{out}$) of the DC to DC converter 120 to be maximal, the following formula (15) is given:

$$\left. \frac{\partial P_{out}}{\partial T_{on}} \right|_{T_{on}=T_{on\_opt}} = 0 \quad (15)$$

Formula (16) can be derived using both formulas (14) and (15).

$$T_{on\_opt} \approx \frac{6L}{8(R_{dcr} + R_{sw}) + 3R_{teg}} \quad (16)$$

As can be seen from formula (13), $V_{in}$ decreases monotonously with respect to $T_{on}$. Therefore, $T_{on\_min}$ and $T_{on\_max}$ are the values of $T_{on}$ which provide $V_{in}$ with $V_{in\_max}$ and $V_{in}=V_{teg}/2$, respectively.

Hence, $T_{on\_max}$ can be derived using formula (13) set forth above, as it is in formula (17) set forth below.

$$T_{on\_max} \approx \frac{2L}{R_{teg}} \quad (17)$$

Likewise, $T_{on\_min}$ can be derived using formulas (10) and (13) set forth above, as it is in formula (18) set forth below.

$$T_{on\_min} \approx \frac{2}{3} \cdot \frac{3R_{teg} - 4(R_{dcr} + R_{sw})}{R_{teg}\{R_{teg} + 4(R_{dcr} + R_{sw})\}} L \quad (18)$$

As described above, the thermoelectric generator of the second embodiment enables the ON time of the switch control signal to be set at a value higher than the lower limit represented by formula (18) and lower than the upper limit represented by formula (17). Therefore, in comparison with the case where the input voltage of the DC to DC converter is set at a value half the open voltage of the thermoelectric element, the thermoelectric generator enables increasing the output power of the DC to DC converter. In addition, the output power can be maximized by setting the ON time of the switch control signal at an optimal value given by formula (16).

(Third Embodiment)

In the thermoelectric generator of the first embodiment described above, the input voltage ($V_{in}$) of the DC to DC converter is set to be within an appropriate range, thereby making the output power of the DC to DC generator greater than the power in the conventional art. Incidentally, the open voltage ($V_{teg}$) of the thermoelectric element is proportional to the temperature difference between a high-temperature member and a low-temperature member, and is not necessarily constant. Desirably, therefore, $V_{teg}$ should be constantly measured and feedback control should be performed for $V_{in}$, so that the fluctuations of $V_{teg}$ do not cause $V_{in}$ to be outside the optimal range described above. The thermoelectric generator of the third embodiment differs from the thermoelectric generator of the first embodiment in that a feedback control mechanism is added to the DC to DC converter.

A thermoelectric generator 600 according to the third embodiment is exemplified in FIG. 6. The thermoelectric generator 600 is obtained by modifying the thermoelectric generator 100 shown in FIG. 2 in such a manner that DC to DC converter 120 is replaced with DC to DC converter 620.

The voltage dividing circuit 620 includes an input terminal and an output terminal. The input terminal of the DC to DC converter 620 is connected to the output terminal of the thermoelectric element 110. The output terminal of the DC to DC converter 620 is connected to the output terminal of the thermoelectric generator 600. The DC to DC converter 620 produces an output voltage ($V_{out}$) by increasing (or decreasing) the input voltage ($V_{in}$). The DC to DC converter 620 applies the output voltage ($V_{out}$) to the load 190.

The DC to DC converter 620 includes: an input capacitor 121 ($C_{in}$), an inductor 122, a diode 124, switch 125 (SWL), switch 127, an oscillator 628, a comparator 129 (CMP), an output capacitor 130 ($C_{out}$), a sample and hold circuit 631, a sample and hold control circuit 632, switch 633 ($S_{in}$), amplifier 634, a subtractor 635 and amplifier 636. In FIG. 6, the parasitic resistance 123 of the inductor 122 and the parasitic resistance (ON resistance) 126 of switch 125 are shown.

The input capacitor 121 shown in FIG. 6 differs from the input capacitor shown 121 in FIG. 2 in that the first terminal thereof is connected to the first terminal of the inductor 122, the second terminal of switch 633, and the first input terminal of the subtractor 635.

The inductor 122 shown in FIG. 6 differs from the inductor 122 shown in FIG. 2 in that the first terminal thereof is connected to the first terminal of the input capacitor 121, the second terminal of switch 633, and the first input terminal of the subtractor 635. Switch 127 shown in FIG. 6 differs from switch 127 shown in FIG. 2 in that the first terminal thereof is connected to the output terminal of the oscillator 628.

The oscillator 628 includes a control terminal and an output terminal. The control terminal of the oscillator 628 is connected to the output terminal of the amplifier 636. The output terminal of the oscillator 628 is connected to the first terminal of switch 127 and the input terminal of the sample and hold control circuit 632.

The oscillator 628 receives an oscillator control signal from the amplifier 636 and generates a switch control signal having an ON time determined in accordance with the oscillator control signal. The oscillator 628 supplies the switch control signal to switch 127.

The sample and hold circuit 631 includes an input terminal, an output terminal and a control terminal. The input terminal of the sample and hold circuit 631 is connected to the input terminal of the DC to DC converter 620 and to the first terminal of switch 633. The output terminal of the sample and hold circuit 631 is connected to the input terminal of the amplifier 634. The control terminal of the sample and hold circuit 631 is connected to the output terminal of the sample and hold control circuit 632.

The sample and hold circuit 631 receives a sample/hold control signal (corresponding to a clock signal) from the sample and hold control circuit 632 and operates in either the sample mode or the hold mode in accordance with the sample/hold control signal.

When the sample/hold control signal is at low level, the sample and hold circuit 631 operates in the sample mode. To be specific, the sample and hold circuit 631 samples an input signal. When the sample/hold control signal is at high level, the sample and hold circuit 631 operates in the hold mode. To be specific, the sample and hold circuit 631 keeps applying a voltage to the amplifier 634, with the voltage of a sampled input signal being held, when the operation mode transitions from the preceding sample mode to the current hold mode.

As will be described later, switch 633 is in the OFF state and $I_{in}$ is equal to zero, over the duration when the sample and hold circuit 631 operates in the sample mode. According to formula (3), therefore, a voltage substantially equal to the open voltage ($V_{teg}$) of the thermoelectric element 110 is applied to the input terminal of the DC to DC converter 620. Hence, the sample and hold circuit 631 can hold $V_{teg}$ appearing when the operation mode transitions from the sample mode to the hold mode.

The sample and hold control circuit 632 includes an input terminal and an output terminal. The input terminal of the sample and hold control circuit 632 is connected to the output terminal of the oscillator 628. The output terminal of the sample and hold control circuit 632 is connected to the control terminal of the sample and hold circuit 631 and to the control terminal of switch 633.

The sample and hold control circuit 632 receives a switch control signal from the oscillator 628 and generates a sample/hold control signal, based on the switch control signal. The sample/hold control signal is synchronous with the switch control signal. For example, each of the rising edges of the sample/hold control signal may coincide with one of the rising edges of the switch control signal. The sample and hold control circuit 632 supplies the sample/hold control signal to both the sample and hold circuit 631 and switch 633.

Switch 633 includes a first terminal, a second terminal and a control terminal. The first terminal of switch 633 is connected to the input terminal of the DC to DC converter 620. The second terminal of switch 633 is connected to the first terminal of the input capacitor 121, the first terminal of the inductor 122 and the first input terminal of the subtractor 635. The control terminal of switch 633 is connected to the output terminal of the sample and hold control circuit 632. Although the parasitic resistance (ON resistance) of switch 633 is not depicted in FIG. 6, it may be regarded as being added to parasitic resistance 123.

Switch 633 receives a sample/hold control signal from the sample and hold control circuit 632 and is turned ON/OFF in accordance with the sample/hold control signal. To be specific, switch 633 short-circuits its first and second terminals or disconnects them in accordance with the sample/hold control signal, in such a manner as to switch the inductor 122 between the current-supplied state and the non-current-supplied state.

The amplifier 634 includes an input terminal and an output terminal. The input terminal of the amplifier 634 is connected to the output terminal of the sample and hold circuit 631. The output terminal of the amplifier 634 is connected to the second input terminal of the subtractor 635.

The amplifier 634 amplifies the input voltage ($V_{teg}$) in accordance with a gain $G_1$, thereby generating an amplified signal having a voltage equal to $G_1 V_{teg}$. The amplifier 634 supplies the amplified signal to the subtractor 635.

The subtractor 635 includes a first input terminal, a second input terminal and an output terminal. The first input terminal of the subtractor 635 is connected to the first terminal of the input capacitor 121, the first terminal of the inductor 122 and the second terminal of switch 633. The second input terminal of the subtractor 635 is connected to the output terminal of the amplifier 634. The output terminal of the subtractor 635 is connected to the input terminal of the amplifier 636.

The subtractor 635 subtracts the voltage ($V_{in}$) applied to the first input terminal from the voltage ($G_1 V_{teg}$) applied to the second input terminal. The subtractor 635 applies the differential voltage ($G_1 V_{teg} - V_{in}$) to the input terminal of the amplifier 636.

The amplifier 636 includes an input terminal and an output terminal. The input terminal of the amplifier 636 is connected to the output terminal of the subtractor 635. The output terminal of the amplifier 636 is connected to the control terminal of the oscillator 628.

The amplifier 636 amplifies the input voltage ($G_1V_{teg}-V_{in}$) in accordance with a positive gain (G2) of a proper value, thereby generating an oscillator control signal having a voltage equal to $G_2$ ($G_1V_{teg}-V_{in}$). G2>>1. The amplifier 636 supplies the oscillator control signal to the oscillator 628.

If $V_{in}$ is more than $G_1V_{teg}$, the oscillator control signal has a negative voltage, and the ON time ($T_{on}$) of the switch control signal is controlled to be long. As a result, $V_{in}$ decreases and becomes closer to $G_1V_{teg}$. Conversely, if $V_{in}$ is less than $G_1V_{teg}$, the oscillator control signal has a positive voltage, and the ON time ($T_{on}$) of the switch control signal is controlled to be short. As a result, $V_{in}$ increases and becomes closer to $G_1V_{teg}$. In this manner, the DC to DC converter 620 performs feedback control by which $V_{in}$ is made to approach to $G_1V_{teg}$.

As can be seen, the output power ($P_{out}$) of the DC to DC converter 620 can be made greater than that of the conventional art by properly determining the value of $G_1$.

With respect to an optimal value ($G_{1\_opt}$) that permits the output power ($P_{out}$) of the DC to DC converter 620 to be maximal, the following formula (19) can be derived from formula (9):

$$G_{1\_opt} = \frac{1}{2} \cdot \frac{8(R_{dcr}+R_{sw})+3R_{teg}}{4(R_{dcr}+R_{sw})+3R_{teg}} \quad (19)$$

Likewise, an upper limit of the gain ($G_1$) that makes the output power ($P_{out}$) of the DC to DC converter 620 greater than the conventional value can be derived from formula (10). In addition, a lower limit of the gain ($G_1$) that makes the output power ($P_{out}$) of the DC to DC converter 620 greater than the conventional value can be derived from $G_1V_{teg}=V_{teg}/2$. As can be seen, the output power ($P_{out}$) of the DC to DC converter 620 can be made greater than that of the conventional art by determining the value of the gain ($G_1$) to be within the range expressed by formula (20) set forth below.

$$\frac{1}{2} < G_1 < \frac{3}{2} \cdot \frac{4(R_{dcr}+R_{sw})+R_{teg}}{4(R_{dcr}+R_{sw})+3R_{teg}} \quad (20)$$

As described above, the thermoelectric generator of the third embodiment performs feedback control for the input voltage of the DC to DC converter (to be precise, the ON time of the switch control signal) in such a manner that $V_{in}$ is made to approach to a value obtained by multiplying the open voltage of the thermoelectric element by a gain ($G_1$). The thermoelectric generator determines this gain to be within the range expressed by formula (20). Therefore, in comparison with the case where the input voltage of the DC to DC converter is set at a value half the open voltage of the thermoelectric element, the thermoelectric generator enables increasing the output power of the DC to DC converter. Furthermore, the output power can be maximized by setting the gain at an optimal value given by formula (19).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A thermoelectric generator comprising:
   a thermoelectric device that converts heat energy into electric energy; and
   a DC to DC converter that converts an input voltage applied by the thermoelectric device to a voltage higher than the input voltage applied by the thermoelectric device, wherein
   the input voltage applied by the thermoelectric device is higher than a voltage which is half an open voltage of the thermoelectric device,
   the DC to DC converter includes:
      a first switch which is ON/OFF-controlled in accordance with a switch control signal whose ON time is variable;
      an inductor connected to the first switch;
      a second switch that switches between a state where a current is supplied from the thermoelectric device to the inductor and a state where no current is supplied from the thermoelectric device to the inductor; and
      a sample and hold circuit that samples the open voltage of the thermoelectric device when the second switch is in the state where no current is supplied from the thermoelectric device to the inductor, and holds the sampled open voltage of the thermoelectric device,
   the input voltage applied by the thermoelectric device increases or decreases in accordance with the ON time,
   the ON time is subjected to feedback control such that the input voltage applied by the thermoelectric device approaches to a value obtained by multiplying the held open voltage of the thermoelectric device by a gain, and
   the gain is determined based on an output resistance of the thermoelectric device, a parasitic resistance of the inductor, a parasitic resistance of the first switch, and a parasitic resistance of the second switch.

2. A thermoelectric generator comprising:
   a thermoelectric device that converts heat energy into electric energy; and
   a DC to DC converter that converts an input voltage applied by the thermoelectric device to a voltage higher than the input voltage applied by the thermoelectric device, wherein
   the input voltage applied by the thermoelectric device is higher than a voltage which is half an open voltage of the thermoelectric device,
   the DC to DC converter includes:
      a first switch which is ON/OFF-controlled in accordance with a switch control signal whose ON time is variable;
      an inductor connected to the first switch;
      a second switch that switches between a state where a current is supplied from the thermoelectric device to the inductor and a state where no current is supplied from the thermoelectric device to the inductor; and
      a sample and hold circuit that samples the open voltage of the thermoelectric device when the second switch is in the state where no current is supplied from the thermoelectric device to the inductor, and holds the sampled open voltage of the thermoelectric device,
   the input voltage applied by the thermoelectric device increases or decreases in accordance with the ON time,
   the ON time is subjected to feedback control such that the input voltage applied by the thermoelectric device approaches to a value obtained by multiplying the held open voltage of the thermoelectric device by a gain,
a current flowing through the inductor is subjected to DCM (Discontinuous Conduction Mode) control, and
the gain satisfies a formula set forth below, $$\frac{1}{2} < G_1 < \frac{3}{2} \cdot \frac{4(R_{dcr} + R_{sw}) + R_{teg}}{4(R_{dcr} + R_{sw}) + 3R_{teg}}$$

where
$G_1$ denotes the gain,
$R_{teg}$ denotes an output resistance of the thermoelectric device,
$R_{dcr}$ denotes a parasitic resistance of the inductor and the second switch, and
$R_{sw}$ denotes a parasitic resistance of the first switch.

3. The generator according to claim 2, wherein the gain is substantially equal to a value given by $$\frac{1}{2} \cdot \frac{8(R_{dcr} + R_{sw}) + 3R_{teg}}{4(R_{dcr} + R_{sw}) + 3R_{teg}}.$$

* * * * *